(12) United States Patent
Krymski

(10) Patent No.: US 6,255,970 B1
(45) Date of Patent: Jul. 3, 2001

(54) CORRECTION OF MISSING CODES NONLINEARITY IN A TO D CONVERTERS

(75) Inventor: Alexander Krymski, Montrose, CA (US)

(73) Assignee: Photobit Corporation, Pasadena, CA (US)

( * ) Notice: Subject to any disclaimer, the term of this patent is extended or adjusted under 35 U.S.C. 154(b) by 0 days.

(21) Appl. No.: 09/169,020

(22) Filed: Oct. 8, 1998

Related U.S. Application Data
(60) Provisional application No. 60/061,652, filed on Oct. 10, 1997.

(51) Int. Cl.[7] .................................................. H03M 1/06
(52) U.S. Cl. ............................................ 341/118; 341/155
(58) Field of Search ................................... 341/155, 120, 341/118, 165

(56) References Cited

U.S. PATENT DOCUMENTS

| | | | |
|---|---|---|---|
| 4,712,216 | * 12/1987 | Glaise | 371/38 |
| 4,774,498 | * 9/1988 | Traa | 341/159 |
| 4,903,023 | * 2/1990 | Evans et al. | 341/120 |
| 4,985,702 | * 1/1991 | Penney | 341/118 |
| 5,394,407 | * 2/1995 | Coddington | 371/37.1 |
| 5,528,606 | * 6/1996 | Kondo et al. | 371/37.4 |
| 5,598,157 | * 1/1997 | Kornblum et al. | 341/120 |
| 5,825,316 | * 10/1998 | Kuttner | 341/120 |
| 5,973,632 | * 10/1999 | Tai | 341/156 |
| 6,011,502 | * 1/2000 | Kao | 341/156 |

* cited by examiner

Primary Examiner—Peguy JeanPierre
(74) Attorney, Agent, or Firm—Fish & Richardson P.C.

(57) ABSTRACT

Missing code linearity in an A to D converter is corrected by associating each of the bits of a raw ADC output with a correction code for that bit.

14 Claims, 3 Drawing Sheets

CORRECTION OF MISSING CODES NONLINEARITY IN A TO D CONVERTERS

CROSS REFERENCE TO RELATED APPLICATIONS

This application claims the benefit of the U.S. Provisional Application No. 60/061,652, filed Oct. 10, 1997, which is incorporated herein by reference.

BACKGROUND

A common error in an A to D converter comes from inaccurate relationship among the sizes of the capacitors used in the conversion. For example, a scaled capacitor network uses relative capacitor sizes which are scaled according to the relation of $\frac{1}{2}^n$, where n is between 0 and the maximum number of bits desired. FIG. 1A shows some capacitors, with the relative sizes of 1, $\frac{1}{2}$, $\frac{1}{4}$ ... $\frac{1}{32}$. A differential nonlinearity ("DNL") error is caused by inaccuracies in the capacitances of these scaled capacitors. This differential nonlinearity can cause missing codes.

For example, the effect is shown with reference to FIG. 1B. In FIG. 1B, increasing the voltage one increment beyond the voltage 150 that produces the code 01111111, yields a jump to code 1000011. This means that the codes between 01111111 and 1000011 are never used. These "missing codes" result in granularity of the A/D converter and also effectively reduce the dynamic ranges of the converter since fewer codes are available for use.

It has been suggested to correct this error using a look-up table for each value. However, this requires a large amount of memory.

SUMMARY

The present system describes a technique of correcting and compensating for this systematic error. This is done by assigning a limited universe of correction factors. Each correction factor depends on states of certain bits of the code.

A first embodiment assigns a correction factor to each bit of a code and adds them.

A second embodiment assigns correction factors to certain sets of most significant bits.

DETAILED DESCRIPTION

Figure 1B:
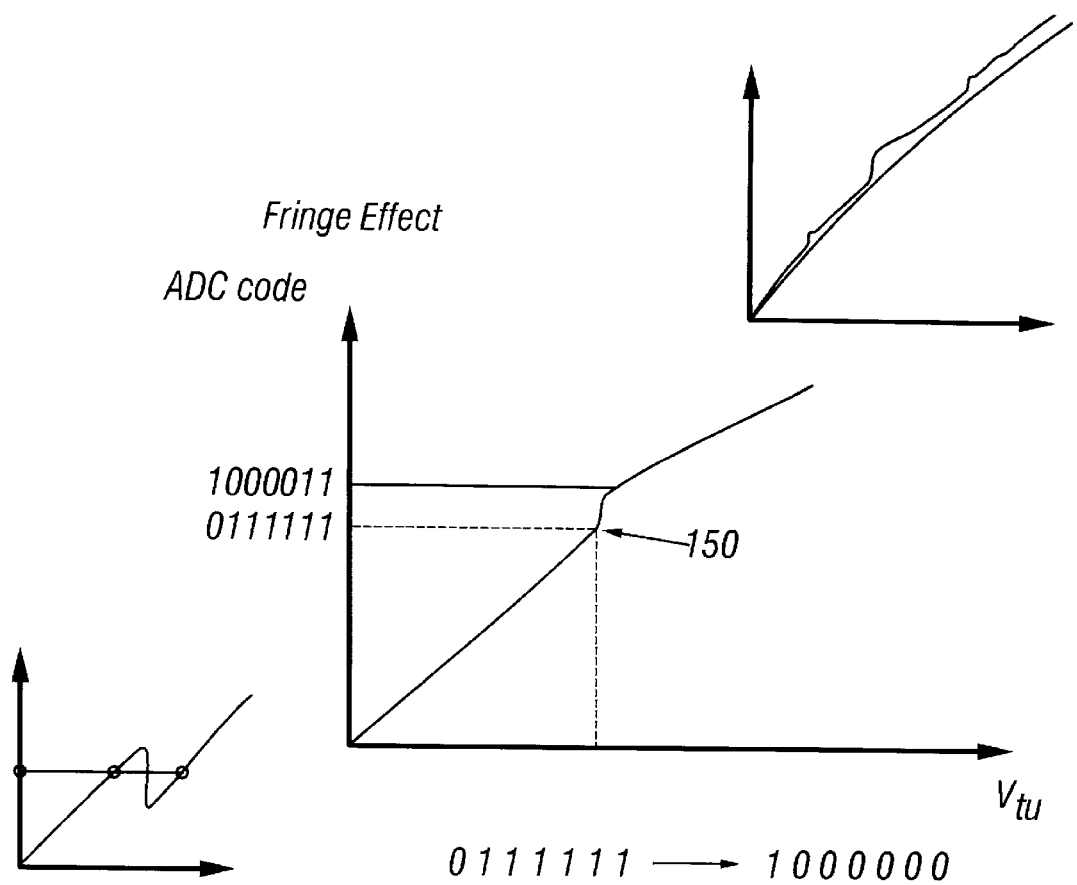
FIGS. 1A and 1B show effects in A to D converters.
Figure 1A:
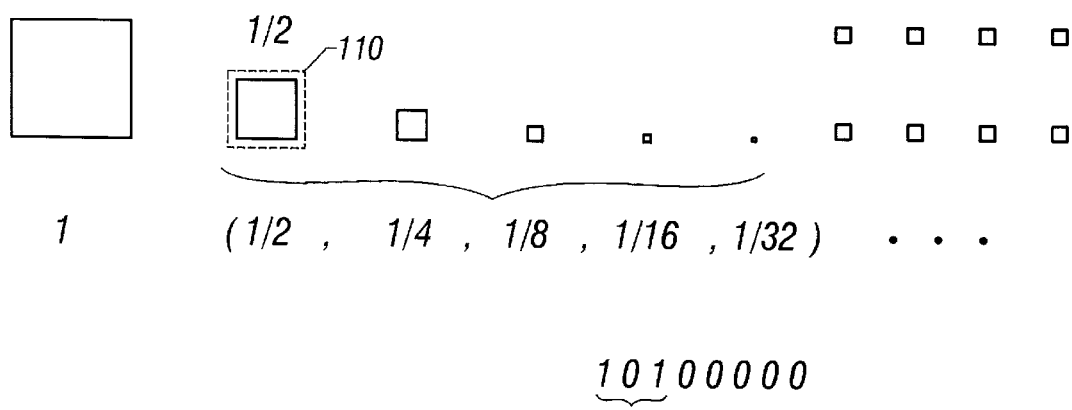

The inventor postulates that fringe effects in these capacitors are largely responsible for the errors. These fringe effects include fringe capacitance effects shown generally as 110 in FIG. 1A. The larger capacitors typically include larger errors.

The inventor recognized that systems of this type, which use a scaled capacitor network, have errors that are visible at the interface between the different bits. For example, the error described above occurs at the transition between the code 01111111 and what should be the next code— 10000000. (See FIG. 1B) These errors were found to be based on the number of bits of the code that are active.

The inventor therefore realized that the nonlinearity could be corrected based on the active bits.

According to this embodiment, illustrated an initial A to D conversion is made by A to D converter 200. The output bits are analyzed to determine which bits include "1"s. Each "1" represents an associated error amount. These error amounts can be determined empirically. For example, a "1" in the most significant bit indicates that the output will include an error factor $e_1$. In the example discussed above, the error $e_1$ is equivalent to the amount of the two lowest bits 00000011. The other error factors shown as $e_2$, $e_3$, $e_4$, and $e_5$ can be similarly determined.

Figure 2:
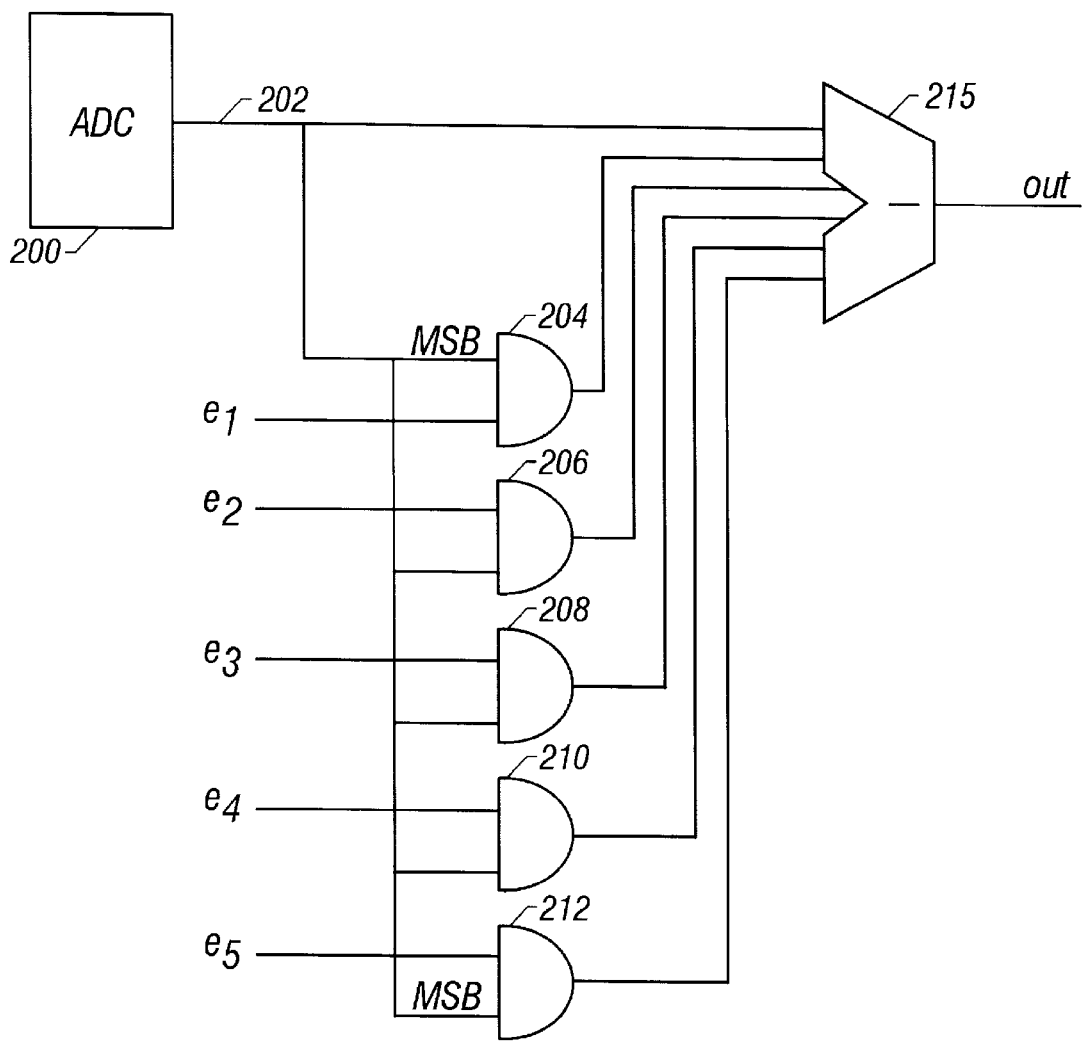
FIG. 2 shows a correction circuit.

The embodiment, which corrects these errors, is shown in the circuit of FIG. 2. A pipelined set of value holding elements 204, 206, 208, 210, 212 are each associated with an error $e_n$. Each element is enabled by a "1" in their corresponding bits. Each element, when enabled, provides the offset to adder 215, to add or subtract the desired offset from the ADC output 202.

For example, when there is a "1" in the MSB, $e_1$ is subtracted. Each subtracting operation is enabled by a "1" in a corresponding A to D converter output bit. Therefore, if the two most significant output bits are active, the A to D converter is corrected by the amount equivalent to $(e_1+e_2)$.

FIG. 2 preferably uses a digital adder 215 to carry out the addition. The value holding elements can be adders, memory locations or other structure. The system as shown can be used for a 5-bit system, or, more preferably, for the most significant 5 bits of an 8-bit system.

Figure 3:
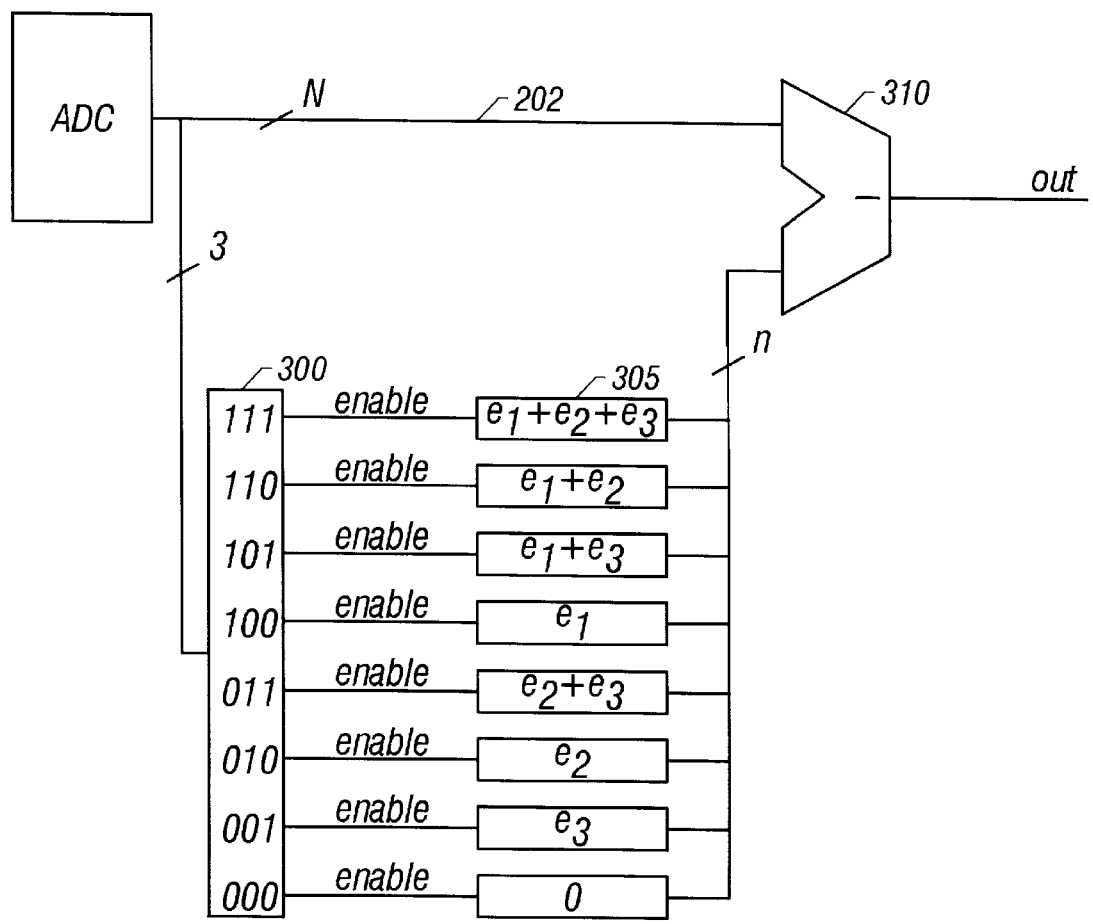
FIG. 3 shows a second correction circuit with prestored information.

A second embodiment is shown in FIG. 3. This circuit uses a decoder 300 for analyzing the major bits. The output enables a sum of errors to be output as a single additive value. The output is added/subtracted to the ADC output 202 by subtractor 310. The architecture for correcting DNL in three most significant bits is shown in FIG. 3. This system does not correct all bit errors, just the most significant errors.

The decoder outputs enable a pre-stored value representing a sum of errors to be added in adder 310. The sum of errors stored in 305 can be memory cells or partial sum adders, for example. This value can be subtracted from the ADC output 202 in real time, or one clock delay later.

Other embodiments are within the enclosed invention.

What is claimed is:

1. A system for correcting missing code nonlinearity in an A to D converter, comprising:

a compensating device, coupled between a raw output of an A to D converter and to form a compensated output of the A to D converter, said compensating device including an offset addition device, determining which of the plurality of bits of said raw output are in a specified state, and producing a compensation factor based on said which of said raw output bits are in said specified state, and changing said raw output into the corrected output based on said compensation factor, such that the missing code nonlinearity caused by inaccuracies in scaled capacitors of the A to D converter is corrected based on said specified state of each of said raw output bits.

2. A system as in claim 1 further comprising a plurality of correction factors, each associated with a bit of said raw output, and a device which adds one of said correction factors when a corresponding bit of said raw output is in said specified state.

3. A system as in claim 1 further comprising a decoder, coupled to said raw output, an output of said decoder providing the correction factor.

4. A system as in claim 2 wherein said compensating device includes a digital adder.

5. A system as in claim 2 where said compensation device includes a memory storing factors that are associated with each bit being active.

6. A system as in claim 2 wherein only some, but not all, bits of said raw output are connected to said compensating device.

7. A method of correcting for a differential nonlinearity in an A to D converter, comprising:

obtaining a raw uncorrected output of an A to D converter;

determining a correction value associated with each of at least a plurality of bits of said raw output;

determining which of said plurality of bits are in a specified state; and correcting said raw output based on which of said bits are in said specified state, such that the differential nonlinearity caused by inaccuracies in scaled capacitors of the A to D converter is corrected based on said specified state of each of said bits.

8. A method as in claim 7 wherein said obtaining comprises determining a number of bits in the raw output which are in the specified state and selecting values associated with each of said bits to correct said raw output.

9. A method as in claim 7 further comprising determining a separate correction value associated with each of said bits being active, and using said bit being in said specified state to enable said correction value to be added to the raw A to D converter output to form a corrected A to D converter output.

10. A system as in claim 8 further comprising obtaining a plurality of bits of the raw A to D converter output, said plurality of bits including at least a most significant bit of the A to D converter output and less than all bits of said output, determining correction factors which will correct for differential nonlinearity for states of each of said plurality of bits, and adjusting the raw output of the A to D converter using said correction factors.

11. An A to D converter correction system, comprising:

a memory, storing a plurality of correction factors, each correction factor indicating a correction factor for a differential nonlinearity associated with a specific bit of an A to D converter;

an A to D converter producing a raw and uncorrected digital output;

an output of said A to D converter connected to both an adder and connected to address said memory to thereby read out only those correction factors which are indicated by states of the digital data bits therein, said digital correction factors being coupled to said adder with said A to D converter to thereby produce a corrected A to D converter output, such that the differential nonlinearity caused by inaccuracies in scaled capacitors of the A to D converter is corrected based on said correction factor associated with said specific bit of the A to D converter.

12. A system as in claim 11 wherein said memory comprises an individual correction factor for each bit of the digital output.

13. A system as in claim 11 wherein the memory comprises a decoder, and a prestored portion including information indicative of prestored bit combinations.

14. A system as in claim 13 further comprising a plurality of memory storing locations, each storing a predetermined summed correction amount, wherein said decoder produces an output which enables each summed amount to be separately added to the raw output of the A to D converter.

* * * * *